United States Patent
Yim et al.

(10) Patent No.: US 6,853,175 B2
(45) Date of Patent: Feb. 8, 2005

(54) APPARATUS AND METHOD FOR MEASURING ELECTRICAL CHARACTERISTICS OF A SEMICONDUCTOR ELEMENT IN A PACKAGED SEMICONDUCTOR DEVICE

(75) Inventors: Sung-min Yim, Yongin (KR); Byong-mo Moon, Seoul (KR); In-ho Song, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 111 days.

(21) Appl. No.: 09/955,310

(22) Filed: Sep. 19, 2001

(65) Prior Publication Data

US 2002/0063570 A1 May 30, 2002

(30) Foreign Application Priority Data

Sep. 19, 2000 (KR) .................................. 2000-54874

(51) Int. Cl.[7] .............................................. G01R 31/02
(52) U.S. Cl. ...................................... 324/73.1; 324/763
(58) Field of Search ......................... 324/73.1, 750–765

(56) References Cited

U.S. PATENT DOCUMENTS

| | | | | |
|---|---|---|---|---|
| 4,970,454 A | * | 11/1990 | Stambaugh et al. | 324/73.1 |
| 5,019,772 A | * | 5/1991 | Dreibelbis et al. | 324/763 |
| 5,153,509 A | * | 10/1992 | Dalrymple et al. | 324/73.1 |
| 5,734,661 A | * | 3/1998 | Roberts et al. | 714/733 |
| 6,275,961 B1 | * | 8/2001 | Roohparvar | 714/718 |
| 6,442,009 B1 | * | 8/2002 | Kameda et al. | 361/56 |

* cited by examiner

Primary Examiner—Evan Pert
Assistant Examiner—Paresh Patel

(57) ABSTRACT

An apparatus and method for measuring the electrical characteristics of a semiconductor device in a packaged state, which includes an electrical characteristic measurer which is connected to an electrical element whose electrical characteristics are to be measured and to one pad of the semiconductor device. The measurer is driven in response to a control signal, and outputs a value indicative of the electrical characteristics of the electrical element to the pad. The measurer includes at least an NMOS threshold voltage measurer, an NMOS saturation current measurer, a PMOS threshold voltage measurer, a PMOS saturation current measurer, and a resistance measurer. An accurate electrical characteristic value can be obtained by measuring the characteristics of the element within a semiconductor device in a finished packaged product. In view of the accurate measurement, degradation of characteristics of the semiconductor device and malfunction thereof can be prevented.

18 Claims, 4 Drawing Sheets

APPARATUS AND METHOD FOR MEASURING ELECTRICAL CHARACTERISTICS OF A SEMICONDUCTOR ELEMENT IN A PACKAGED SEMICONDUCTOR DEVICE

The present application claims priority under 35 U.S.C. §119 to Korean Application No. 2000-54874 filed on Sep. 19, 2000, which is hereby incorporated by reference in its entirety for all purposes.

BACKGROUND OF THE INVENTION

1. Field of the Invention

The present invention relates to semiconductor devices, and more particularly, to an apparatus and method for measuring the characteristics of electrical elements in a packaged semiconductor device.

2. Description of the Related Art

A semiconductor integrated circuit and a semiconductor device are obtained by forming electrical elements such as a transistor, a resistor and a capacitor within a wafer, and connecting them to each other to form a predetermined pattern. In the initial designing process of semiconductor devices, the characteristics of a finished product are predicted by simulation, using a model parameter for a process to be applied. Thus, the accuracy of the model parameter which is used at the early stage of designing, and which represents the electrical characteristics of electrical elements, is very important. However, generally, the dispersion of the characteristics of electrical elements increases as the integration of an integrated circuit increases.

However, in conventional systems, a method of monitoring the characteristics of electrical elements within a selected arbitrary wafer and applying the results of the monitoring to a model parameter has been used. Thus, the electrical characteristic monitored by a conventional technique cannot represent the electrical characteristics of all wafers and chips. Also, this measurement of the electrical characteristics of electrical elements in a wafer does not reflect the electrical characteristics of electrical elements in a finished packaged product. Accordingly, the dispersion of the characteristics of semiconductor devices increases. Therefore, many semiconductor devices depart from a predetermined characteristic range, resulting in the deterioration in the characteristics of semiconductor devices and the malfunction of semiconductor devices. In particular, in the case of semiconductor devices that operate fast, the probability of malfunction increases.

SUMMARY OF THE INVENTION

The present application is therefore directed to an apparatus and method for measuring the electrical characteristics of a semiconductor device, which substantially overcomes one or more of the problems due to the limitations and disadvantages of the related art.

To solve the above problems, it is an object of the present invention to provide an apparatus and method for measuring the electrical characteristics of a semiconductor device, in which the characteristics of electrical elements within a semiconductor device in the state of a packaged finished product are measured, and the measured results are provided to a circuit for tuning the characteristics of semiconductor devices, thereby preventing the characteristics of a semiconductor device from being distorted.

Accordingly, these and other objects of the present invention are achieved by an apparatus for measuring the characteristics of an electrical element within a semiconductor device in a packaged state, the apparatus including an electrical characteristic measurer which is connected to the electrical element and a pad of the semiconductor device, and which is driven in response to a predetermined control signal to output a value which reflects or is indicative of the electrical characteristics of the electrical element, to the pad. The control signal is activated in a predetermined electrical characteristic measuring mode after the semiconductor device is packaged.

These and other objects of the present invention are also achieved by a method of measuring the characteristics of an electrical element within a semiconductor device in a packaged state, the method including: (a) entering the semiconductor device into a predetermined electrical characteristic measuring mode after the semiconductor device is packaged; (b) generating a predetermined control signal; (c) outputting a value which reflects or is indicative of the electrical characteristics of the electrical element to a pad of the semiconductor device, by driving an electrical characteristic measurer connected to the electrical element and the pad in response to the control signal.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

Figure 1:
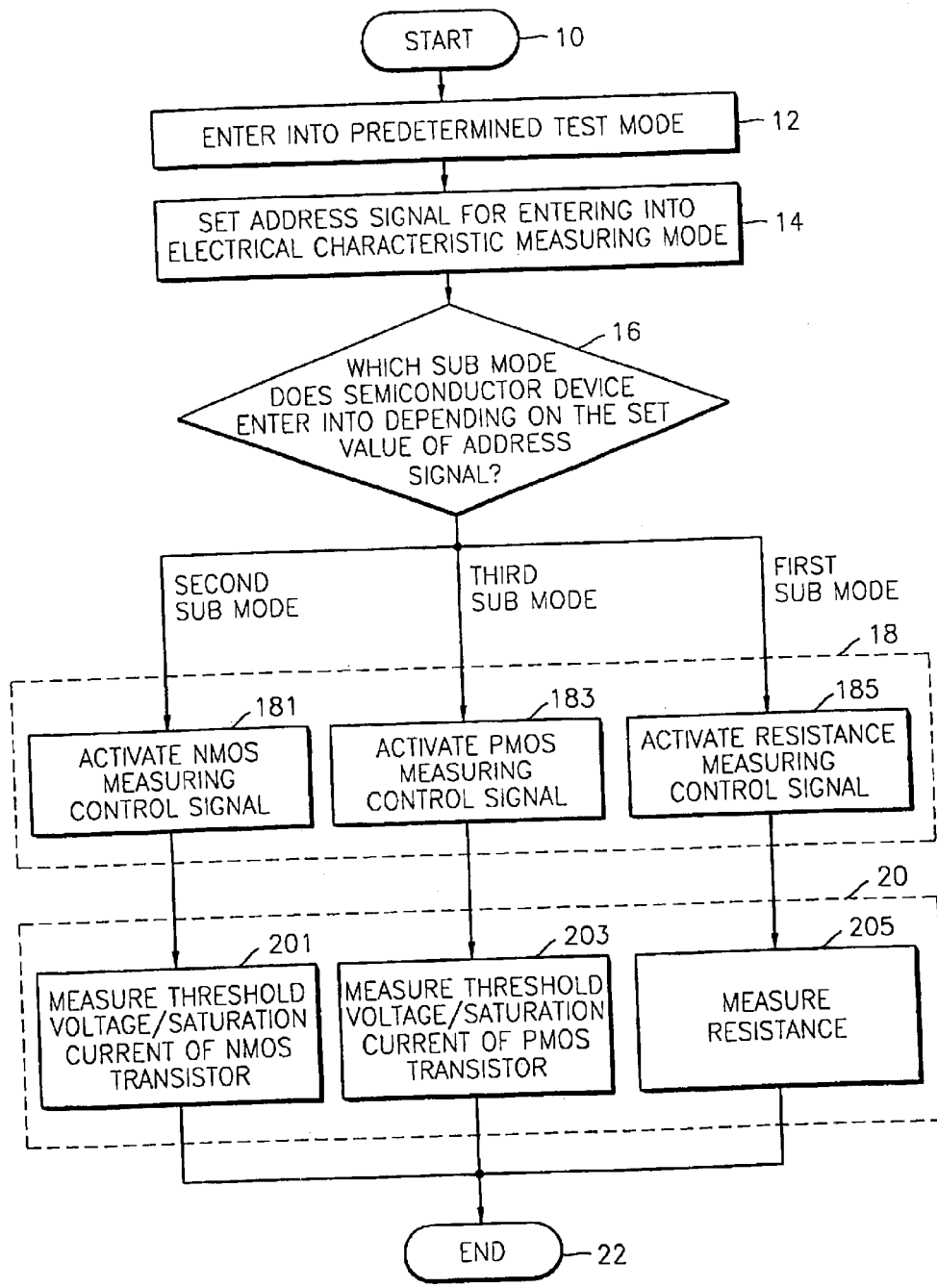
FIG. 1 is a flowchart for illustrating a method of measuring the electrical characteristics of a semiconductor device, according to an embodiment of the present invention.

The accompanying drawings illustrate preferred embodiments of the present invention, and the content of the drawings must be referred to in order to gain a sufficient understanding of the merits of the present invention and the operation thereof, and the objectives accomplished by the operation of the present invention. Hereinafter, the present invention will be described in detail by explaining preferred embodiments of the present invention with reference to the attached drawings. For ease of explanation, signals and members that perform the same function in the drawings are represented by the same reference characters and reference numerals.

FIG. 1 is a flow chart for illustrating a method of measuring the electrical characteristics of a semiconductor device, according to an embodiment of the present invention. Referring to FIG. 1, first, a semiconductor device is controlled to enter into a predetermined test mode instead of a normal operation mode, as in step 12.

Figure 2:
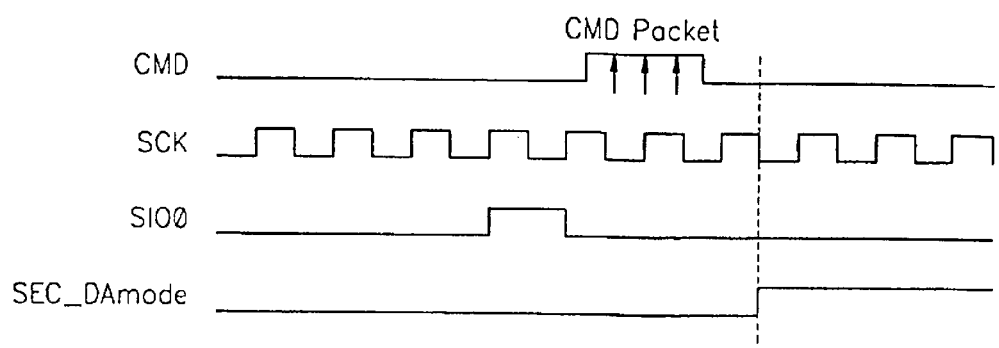
FIG. 2 is a timing diagram for controlling a semiconductor device to enter into a test mode according to the present invention.

FIG. 2 is a timing diagram illustrating how a semiconductor device is controlled to enter into a test mode by signals provided from a memory controller, according to the present invention. Referring to FIG. 2, in a test mode, signal SEC_DAmode is activated using a command word CMD (command input signal), a clock signal SCK (clock input signal) and a serial input signal SIO0 ($0^{th}$ input/out signal). The SIO0, CMD and SCK signals are used for initializing the device, selecting operation mode, and particularly testing the device. When the test mode signal SEC_DAmode is activated, a semiconductor device enters into a test mode. The command word CMD is received on a packet-by-packet basis. A command word packet is received over three consecutive edges of the clock signal SCK. A predetermined serial input signal SIO0 is also received. The combination of the three signals can activate the test mode signal SEC_DAmode.

More particularly, the serial input signal SIO0, the command signal CMD and the clock signal SCK are read from and written to a control register having information on the initialization of the semiconductor device. According to the combination of the three signals, the semiconductor device enters into the test mode. Generation of the test mode signal (SEC_DAmode) is as follows. The serial input signal SIO0 is enabled when clock signal SCK transits from a low state to a high state. After this transit of clock signal SCK from the low state to the high state, command word CMD thereafter transits from the low state to the high state between the following first rising edge and first falling edge of clock signal SCK. Command word CMD thereafter transits from the high state to the low state between the following second falling edge and third rising edge of clock signal SCK. Then, SEC_DAmode transits from the low state to the high state at the following first falling edge of clock signal SCK, after command word CMD transits from the high state to the low state.

Referring back to FIG. 1, after the semiconductor device enters into a test mode, it is controlled to enter into an electrical characteristics measuring mode. This includes a step 14 for generating an address signal TestA to control the semiconductor device to enter into an electrical characteristics measuring mode, and a step 16 for controlling the semiconductor device to enter into a specific sub mode of the electrical characteristics measuring mode, according to the set value of the address signal TestA.

Figure 3:
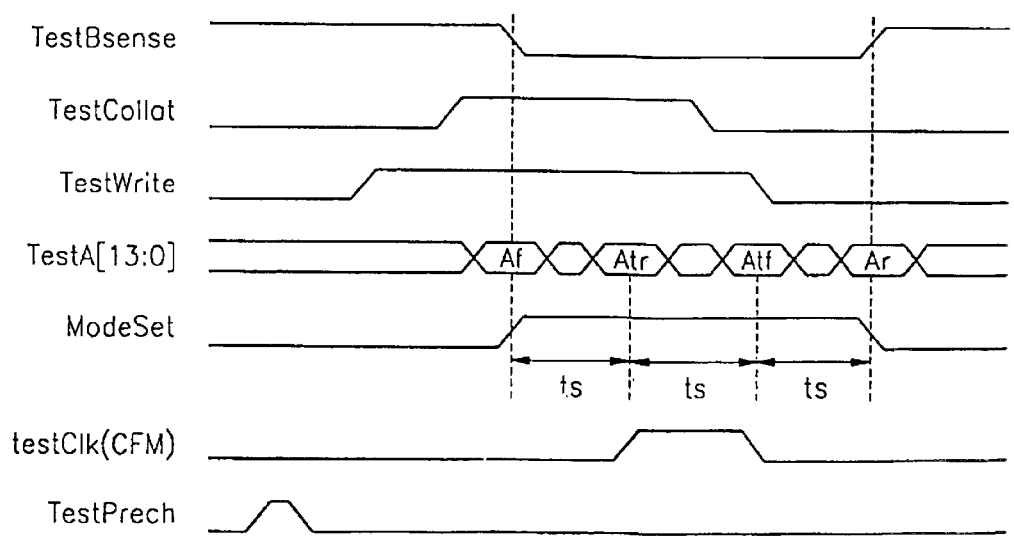
FIG. 3 is a timing diagram for controlling a semiconductor device to enter into an electrical characteristics measuring mode according to the present invention.

FIG. 3 is a timing diagram for controlling a semiconductor device to enter into an electrical characteristics measuring mode according to the present invention. The address signal TestA is used to control the semiconductor device to enter into the electrical characteristics measuring mode. The address signal TestA consists of 14 bits, and a semiconductor device can be controlled to be entered into a specific operation mode, depending on the combination of these bits. The address signal TestA is received in synchronization with the rising and falling edges of a test row active signal TestBsense and a test clock signal TestClk. The time interval ts between address signals TestA is the same. The test row active signal TestBsense and the test clock signal TestClk are used after the test mode signal SEC_DAmode is activated, that is, in a test mode.

Incidentally, the TestBsense signal corresponds to an RAS signal of a DRAM. The TestCollat signal corresponds to a CAS signal of a DRAM. The TestWrite signal commands write enable and the TestPrech signal commands bit line precharging. The ModeSet signal transits from a low state to a high state when the TestBsense signal transits from a high state to a low state, while the TestCollat signal and the TestWrite signal are in a high state. The ModeSet signal transits from the high state to the low state when the TestBsense signal transits from the low state to the high state, while the TestCollat and the TestWrite signal are in the low state.

In this embodiment, a semiconductor device is controlled to enter into the electrical characteristics measuring mode by the combination of the tenth and eleventh bits Atr10 and Atr11 of the address signal TestA. Strictly speaking, the semiconductor device enters into a specific sub mode of the electrical characteristics measuring mode. Four sub modes can be obtained by the combination of two bits, and the number of sub modes can be sufficiently increased by adjusting the number of bits used for an address signal. Table 1 shows sub modes and control signals depending on the combination of bits of an address signal.

TABLE 1

| sub mode | address signal (TestA) | | | | | control signal |
|---|---|---|---|---|---|---|
| | Atr0 | ... | Atr10 | Atr11 | ... | Atr13 | |
| ... | — | ... | — | — | ... | — | — |
| ET0 | 0 | ... | 0 | 0 | ... | 0 | ET_rs |
| ET1 | 0 | ... | 0 | 1 | ... | 0 | ET_nmos |
| ET2 | 0 | ... | 1 | 0 | ... | 0 | ET_pmos |
| reserved | 0 | ... | 1 | 1 | ... | 0 | — |
| ... | — | ... | — | — | ... | — | — |

As can be seen from Table 1, when the tenth and eleventh bits Atr10 and Atr11 of the address signal TestA are '00', the semiconductor device enters into the first sub mode ET0. When the tenth and eleventh bits Atr10 and Atr11 of the address signal TestA are '01', the semiconductor device enters into the second sub mode ET1. When the tenth and eleventh bits Atr10 and Atr11 of the address signal TestA are '10', the semiconductor device enters into the third sub mode ET2. When the tenth and eleventh bits Atr10 and Atr11 of the address signal TestA are '11', a sub mode of the semiconductor device is reserved.

Referring back to FIG. 1, after the step 16, an appropriate control signal for controlling a sub mode is generated in each of the sub modes, in step 18. In step 185, a resistance measuring control signal ET_rs is activated in the first sub mode ET0. In step 181, an NMOS measuring control signal ET_nmos is activated in the second sub mode ET1. In step 183, a PMOS measuring control signal ET_pmos is activated in the third sub mode ET2.

Figure 4:
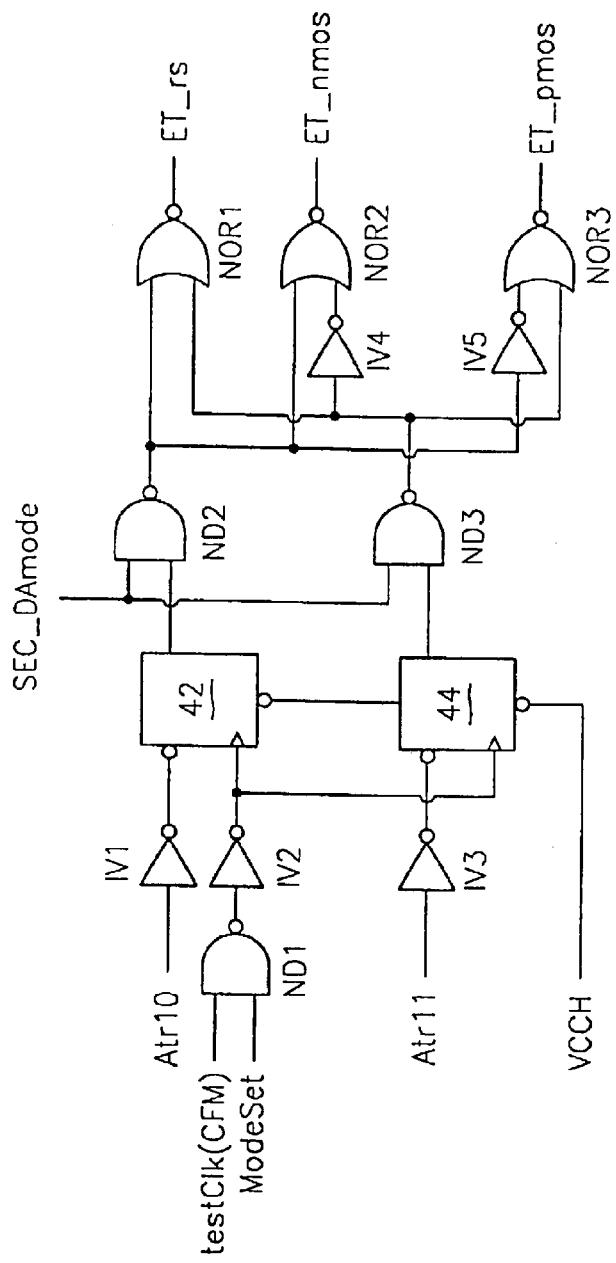
FIG. 4 is a circuit diagram of a circuit for generating a control signal, according to an embodiment of the present invention.

FIG. 4 shows an example of a control signal generation unit according to an embodiment of the present invention. The tenth and eleventh address bits Atr10 and Atr11 of a received address signal TestA are inverted by inverters IV1 and IV3, and received by flip-flops 42 and 44, respectively, when the test clock signal testClk and a mode set signal ModeSet are at a logic high level. The test clock signal testClk and the mode set signal ModeSet undergo a NAND operation in NAND gate ND1. The output of NAND gate ND1 is provided to inverter IV2, which provides a control signal to flip-flops 42 and 44. Each of the output signals of the flip-flops 42 and 44 are NAND-operated with the test mode signal SEC_DAmode by NAND gates ND2 and ND3.

It is to be understood that VCCH of FIG. 4 is an indicating signal for detecting the level of a power supply voltage. When power is supplied to a semiconductor device, the power supply voltage rises from 1 Volt to VCC Volts (for example 2.5V). The logic level of VCCH transits from low state to high state when the power supply voltage reaches some predetermined level.

The output signal of a NAND gate ND2 and the output signal of a NAND gate ND3 are applied to a NOR gate NOR1. The output signal of the NOR gate NOR1 is the resistance measuring control signal ET_rs. The output signal of the NAND gate ND2, and the output signal of the NAND gate ND3 inverted by inverter IV4, are applied to a NOR gate NOR2. The output signal of the NOR gate NOR2 is the NMOS measuring control signal ET_nmos. The output signal of the NAND gate ND2 inverted by inverter IV5, and the output signal of the NAND gate ND3, are applied to a NOR gate NOR3. The output signal of the NOR gate NOR3 is the PMOS measuring control signal ET_pmos. Accordingly, responsive to the tenth and eleventh address bits Atr10 and Atr11 of the received address signal TestA, one of the resistance measuring control signal ET_rs, the NMOS measuring control signal ET_nmos and the PMOS measuring control signal ET_pmos is activated.

Then, the characteristics of electrical elements are measured in response to the activated control signal, in step 20 of FIG. 1. That is, when the NMOS measuring control signal ET_nmos is activated, the threshold voltage and/or saturation current of an NMOS transistor are measured, in step 201. When the PMOS measuring control signal ET_pmos is activated, the threshold voltage and/or saturation current of a PMOS transistor are measured, in step 203. When the resistance measuring control signal ET_rs is activated, the resistance of an electrical element is measured in step 205. An apparatus for measuring the threshold voltage and saturation current of an NMOS transistor, the threshold voltage and saturation current of a PMOS transistor, and the resistance of an electrical element will now be described in detail with reference to FIG. 5.

Figure 5:
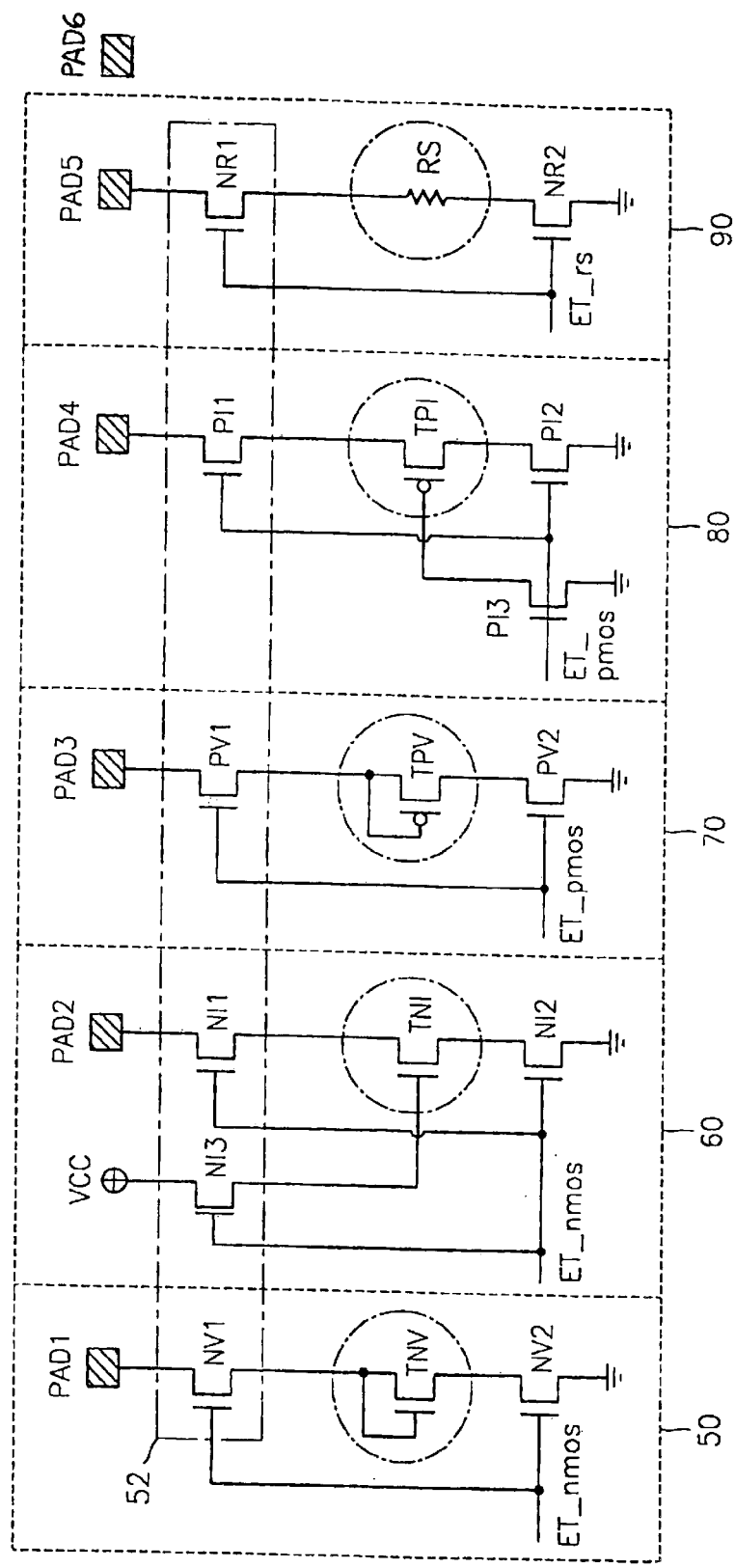
FIG. 5 is a block diagram of an apparatus for measuring the electrical characteristics of a semiconductor device, according to an embodiment of the present invention.

FIG. 5 is a block diagram of an apparatus for measuring the electrical characteristics of a semiconductor device, according to an embodiment of the present invention. Referring to FIG. 5, the apparatus for measuring the electrical characteristics of a semiconductor device includes an electrical characteristic measurer. The electrical characteristic measurer is connected to an electrical element whose electrical characteristics are to be measured, and to one pad within a semiconductor device. The electrical characteristic measurer is driven in response to a control signal, and outputs a value to the pad that reflects or is indicative of the electrical characteristics of the electrical element.

For example, the pads (PAD1 to PAD5) of FIG. 5 are part of RQ PADs of the semiconductor device. RQ PADs receive external addresses or commands. All DQ pads for receiving and outputting data include both an input receiver and an output driver. But RQ pads for receiving external addresses or commands include on an input receiver. In order to match input capacitance between DQ pads and RQ pads, each RQ pad includes a dummy output driver. In the present invention, an apparatus for measuring the electrical characteristics of a semiconductor device is substituted for the dummy output driver, as will be described as follows.

The electrical characteristic measurer includes at least one of an NMOS threshold voltage measuring unit 50, an NMOS saturation current measuring unit 60, a PMOS threshold voltage measuring unit 70, a PMOS saturation current measuring unit 80, and a resistance measuring unit 90.

The NMOS threshold voltage measuring unit 50 includes first and second transistors NV1 and NV2. An NMOS transistor TNV of a semiconductor device that is to be measured, is connected to the NMOS threshold voltage measuring unit 50. The drain of the first transistor NV1 is connected to a pad PAD1 of the semiconductor device, and the source thereof is connected to the drain of the NMOS transistor TNV. The drain and source of the second transistor NV2 are connected to the source of the NMOS transistor TNV and a ground voltage, respectively. The drain and gate of the NMOS transistor TNV are connected to each other, and an NMOS measuring control signal ET_nmos is applied to the gates of the first and second transistors NV1 and NV2.

When the NMOS measuring control signal ET_nmos is activated, the first and second transistors NV1 and NV2 are turned on. Thus, current of a predetermined value flows into the NMOS transistor TNV, and a voltage level that provides indication of the threshold voltage of the NMOS transistor TNV, appears at the pad PAD1. Hence, the threshold voltage of the NMOS transistor TNV can be measured.

The NMOS saturation current measuring unit 60 includes third, fourth and fifth transistors NI1, NI2 and NI3. An NMOS transistor TNI of a semiconductor device that is to be measured, is connected to the NMOS saturation current measuring unit 60. The structures and connections of the third and fourth transistors NI1 and NI2 and the NMOS transistor TNI are the same as those of the first and second transistors NV1 and NV2 and the NMOS transistor TNV of the NMOS threshold voltage measuring unit 50. However, the gate and drain of NMOS transistor TN1 are not connected to each other. Also, the NMOS saturation current measuring unit 60 further includes the fifth transistor NI3. The gate of the fifth transistor NI3 receives an NMOS measuring control signal ET_nmos, and the drain and source thereof are connected to a power supply voltage VCC and the gate of the NMOS transistor TN1, respectively.

When the NMOS measuring control signal ET_nmos is activated, the third, fourth and fifth transistors NI1, NI2 and NI3 are turned on. Thus, a saturation current flows into the NMOS transistor TNI, and the value of the saturation current can be measured through a pad PAD2 of the semiconductor device.

The PMOS threshold voltage measuring unit 70 can have a similar structure as the NMOS threshold voltage measuring unit 50. That is, the NMOS threshold voltage measuring unit 70 includes sixth and seventh transistors PV1 and PV2. A PMOS transistor TPV of a semiconductor device that is to be measured, is connected to the PMOS threshold voltage measuring unit 70. The connections of the sixth and seventh transistors PV1 and PV2 and the PMOS transistor TPV are the same as those of the first and second transistors NV1 and NV2 and the NMOS transistor TNV of the NMOS threshold voltage measuring unit 50. The gates of the fifth and sixth transistors PV1 and PV2 receive a PMOS measuring control signal ET_pmos.

When the PMOS measuring control signal ET_pmos is activated, the sixth and seventh transistors PV1 and PV2 are turned on. Thus, current having a predetermined value flows into the PMOS transistor TPV, and thus a voltage level that provides indication of the threshold voltage of the PMOS transistor TPV, appears at a pad PAD3 of the semiconductor device.

The PMOS saturation current measuring unit 80 can have a similar structure as the NMOS saturation current measuring unit 60. That is, the PMOS saturation current measuring unit 80 includes eighth, ninth and tenth transistors PI1, PI2 and PI3, as in the NMOS saturation current measuring unit 60. A PMOS transistor TPI of a semiconductor device that is to be measured, is connected to the PMOS saturation current measuring unit 80. The connections of the eighth, ninth and tenth transistors PI1, PI2 and PI3 and the PMOS transistor TPI are the same as those of the third, fourth and fifth transistors NI1, NI2 and NI3 and the NMOS transistor TNI of the NMOS threshold voltage measuring unit 60. The gate of the tenth transistor PI3 receives a PMOS measuring control signal ET_pmos, and the drain and source thereof are connected to a ground voltage and the gate of the PMOS transistor TP1, respectively.

When the PMOS measuring control signal ET_pmos is activated, the eighth, ninth and tenth transistors PI1, PI2 and PI3 are turned on. Thus, a saturation current flows into the PMOS transistor TPI, and the value of the saturation current can be measured through a pad PAD4 of the semiconductor device.

The resistance measuring unit 90 can have a similar structure as the NMOS threshold voltage measuring unit 50. That is, the resistance measuring unit 90 includes eleventh and twelfth transistors NR1 and NR2, as in the NMOS threshold voltage measuring unit 50. However, in the resistance measuring unit 90, a resistor RS of a semiconductor device will be measured. A resistance measuring control signal ET_rs is received by the gates of the eleventh and twelfth transistors NR1 and NR2.

When the resistance measuring control signal ET_rs is activated, the eleventh and twelfth transistors NR1 and NR2 are turned on. Thus, current having a predetermined value flows into the resistor RS, and thus a voltage level that provides indication of a voltage reduction in the resistor RS, appears at a pad PAD5 of the semiconductor device. The value indicative of the resistance of the resistor RS can be measured through the pad PAD5.

In this embodiment, the first through twelfth transistors NV1, NV2, NI1–NI3, PV1, PV2, PI1–PI3, NR1 and NR2 are all NMOS transistors. Also, the transistors in a transistor group 52 connected to the pads PAD1 through PAD5 of the semiconductor device may have the same size as an NMOS transistor connected to the pad PAD6 of a data input and/or output pin 30. Thus, the input capacitance for the pads PAD1 through PAD5 can be matched with that of the pad PAD6 of the data input and/or output pin.

According to the present invention, a more accurate electrical characteristic value can be obtained by measuring the characteristics of electrical elements within a semiconductor device in a finished packaged product. Since the obtained electrical characteristic value can be provided to a circuit for tuning the characteristics of a semiconductor device, a degradation in the characteristics of a semiconductor device and the malfunction thereof can be prevented.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An apparatus that measures electrical characteristics of an electrical element within a semiconductor device in a packaged state, comprising;

an electrical characteristic measurer that is connected to the electrical element and a pad of the semiconductor device, said electrical characteristic measurer being driven in response to a control signal to output to the pad a value that is indicative of the electrical characteristics of the electrical element, the control signal being activated in an electrical characteristic measuring mode, after the semiconductor device is packaged, wherein the pad is not connected to any output driver of the semiconductor device.

2. The apparatus of claim 1, further comprising a control signal generator that receives at least one bit of an address signal that is received at the semiconductor device, and that generates die control signal responsive thereto.

3. The apparatus of claim 1, wherein the electrical element is selected from a group including an NMOS transistor, a PMOS transistor arid a resistor, and the value is indicative of one of a threshold voltage and a saturation current of the NMOS transistor, one of a threshold voltage and a saturation current of the PMOS transistor, and a resistance of the resistor.

4. The apparatus of claim 1, wherein the electrical element is a transistor, and the value is indicative of one of a threshold voltage and a saturation current of the transistor.

5. The apparatus of claim 4, wherein the transistor is an NMOS transistor.

6. The apparatus of claim 4, wherein the transistor is a PMOS transistor.

7. The apparatus of claim 1, wherein the electrical element is a resistor, and the value is indicative of a resistance of the resistor.

8. The apparatus of claim 1, wherein the electrical characteristic measurer is adapted to supply a fixed current to the electrical element.

9. The apparatus of claim 8, wherein the electrical element is one of an NMOS and PMOS transistor and wherein, in response to the fixed current, the electrical characteristic measurer outputs a voltage indicating a threshold voltage of the electrical element.

10. The apparatus of claim 8, wherein the electrical element is a resistor and wherein, in response to the fixed current, the electrical characteristic measurer outputs a value indicating a resistance of the resistor.

11. The apparatus of claim 1, wherein the electrical element is one of an NMOS and PMOS transistor and wherein the electrical characteristic measurer is adapted to supply a fixed voltage to the electrical element.

12. An apparatus for measuring characteristics of an electrical element within a semiconductor device in a packaged state, comprising:

a control signal generator, coupled to receive an address signal of the semiconductor device, that generates a control signal; and an electrical characteristic measurer, to which the electrical element is connected, that is driven responsive to the control signal to output to a first pad of the semiconductor device a value indicative of the electrical characteristics of the electrical element, wherein the first pad is not connected to any output driver of the semiconductor device.

13. The apparatus of claim 12, wherein the electrical element is one of a transistor and a resistor, the electrical characteristic measurer comprising at least one transistor characteristic measuring unit that measures the electrical characteristics of the transistor, and a resistor characteristic measuring unit that measures the electrical characteristics of the resistor, as selectable by the control signal.

14. The apparatus of claim 13, wherein the electrical characteristics of the transistor are one of a threshold voltage and a saturation current.

15. The apparatus of claim 10, wherein the electrical characteristics of the resistor is a resistance.

16. The apparatus of claim 13, wherein the control signal generator generates the control signal responsive only to two bits of the address signal.

17. The apparatus of claim 12, wherein the control signal is generated during an electrical characteristic measuring mode, after the semiconductor device is packaged.

18. The apparatus of claim 12, wherein the electrical characteristic measurer includes an NMOS transistor having a drain and a source, one of the drain and the source being connected to the first pad, and the other of the drain and the source being connected to a terminal of the electrical element, a size of the NMOS transistor being the same as a size of an NMOS transistor connected to a second pad that is connected to a data input/output pin, wherein an output driver of the semiconductor device is connected to the second pad.

* * * * *